US007816638B2

(12) United States Patent
Olson et al.

(10) Patent No.: US 7,816,638 B2
(45) Date of Patent: Oct. 19, 2010

(54) LED ARRAY HAVING ARRAY-BASED LED DETECTORS

(75) Inventors: Steven J. Olson, Portland, OR (US); Duwayne R. Anderson, Saint Helens, OR (US); Robert G. Culter, Beaverton, OR (US); Mark D. Owen, Beaverton, OR (US)

(73) Assignee: Phoseon Technology, Inc., Hillsboro, OR (US)

( * ) Notice: Subject to any disclaimer, the term of this patent is extended or adjusted under 35 U.S.C. 154(b) by 0 days.

(21) Appl. No.: 11/095,210

(22) Filed: Mar. 30, 2005

(65) Prior Publication Data

US 2005/0230600 A1 Oct. 20, 2005

Related U.S. Application Data

(60) Provisional application No. 60/558,205, filed on Mar. 30, 2004.

(51) Int. Cl.
*H01L 31/00* (2006.01)

(52) U.S. Cl. .............................. 250/214.1; 250/339.04; 257/431

(58) Field of Classification Search ............ 250/339.02, 250/339.04, 214.1, 208.1, 208.2; 315/291, 315/149, 552, 555; 257/431, 433
See application file for complete search history.

(56) References Cited

U.S. PATENT DOCUMENTS

| | | | | |
|---|---|---|---|---|
| 3,586,959 | A | 6/1971 | Eccles et al. | |
| 3,936,686 | A | 2/1976 | Moore | |
| 4,011,575 | A | 3/1977 | Groves | |
| 4,435,732 | A | 3/1984 | Hyatt | |
| 4,529,949 | A * | 7/1985 | de Wit et al. | 330/289 |
| 4,530,040 | A | 7/1985 | Petterson | |
| 4,544,642 | A | 10/1985 | Maeda et al. | |

(Continued)

FOREIGN PATENT DOCUMENTS

EP 0935145 8/1999

(Continued)

OTHER PUBLICATIONS

PCT International Search Report and Written Opinion dated Jun. 7, 2006 for International International Application No. PCT/US04/36046, filed Oct. 29, 2004, 6 pages.

(Continued)

*Primary Examiner*—Georgia Y Epps
*Assistant Examiner*—Francis M Legasse, Jr.
(74) *Attorney, Agent, or Firm*—Marger Johnson & McCollom, P.C.

(57) ABSTRACT

The present invention provides an optical system having an array of light emitting semiconductor devices to performing an operation that have multiple characteristics associated with performing the operation. The array includes at least one detector located within the array to selectively monitor multiple characteristics of the light emitting semiconductor devices and is configured to generate a signal corresponding to the selected characteristic. A controller is configured to control the light emitting semiconductor devices in response to the signal from the at least one detector. At least one of the multiple characteristics may be concentrated at an area of the array and the at least one detector may be located within the array at the area of the array to selectively monitor characteristic that is concentrated at the area of the array.

14 Claims, 7 Drawing Sheets

U.S. PATENT DOCUMENTS

| | | | | |
|---|---|---|---|---|
| 4,595,289 | A | 6/1986 | Feldman et al. | |
| 4,680,644 | A | 7/1987 | Shirato et al. | |
| 4,684,801 | A | 8/1987 | Carroll et al. | |
| 4,734,714 | A | 3/1988 | Takasu et al. | |
| 5,003,357 | A | 3/1991 | Kim et al. | |
| 5,150,623 | A | 9/1992 | Woods | |
| 5,195,102 | A | 3/1993 | McLean et al. | |
| 5,296,724 | A | 3/1994 | Ogata et al. | |
| 5,311,353 | A * | 5/1994 | Crawford | 359/333 |
| 5,397,867 | A | 3/1995 | Demeo | |
| 5,418,384 | A | 5/1995 | Yamana et al. | |
| 5,424,544 | A | 6/1995 | Shelton et al. | |
| 5,436,710 | A | 7/1995 | Uchiyama | |
| 5,490,049 | A | 2/1996 | Montalan et al. | |
| 5,522,225 | A | 6/1996 | Eskandari | |
| 5,554,849 | A * | 9/1996 | Gates | 250/370.08 |
| 5,555,038 | A | 9/1996 | Conway | |
| 5,623,510 | A | 4/1997 | Hamilton et al. | |
| 5,632,551 | A | 5/1997 | Roney et al. | |
| 5,660,461 | A | 8/1997 | Ignatius et al. | |
| 5,670,780 | A | 9/1997 | Lewis | |
| 5,698,866 | A | 12/1997 | Doiron et al. | |
| 5,705,788 | A | 1/1998 | Beyer et al. | |
| 5,715,270 | A | 2/1998 | Zediker et al. | |
| 5,719,589 | A | 2/1998 | Norman et al. | |
| 5,806,965 | A | 9/1998 | Deese | |
| 5,857,767 | A | 1/1999 | Hochstein | |
| 5,877,899 | A | 3/1999 | Stern et al. | |
| 5,892,579 | A | 4/1999 | Elyasaf et al. | |
| 5,910,706 | A | 6/1999 | Stevens et al. | |
| 6,033,087 | A | 3/2000 | Shozo et al. | |
| 6,058,012 | A | 5/2000 | Cooper et al. | |
| 6,077,073 | A | 6/2000 | Jacob | |
| 6,088,185 | A * | 7/2000 | Ratliff et al. | 360/77.03 |
| 6,118,383 | A * | 9/2000 | Hegyi | 340/602 |
| 6,141,040 | A | 10/2000 | Toh | |
| 6,155,699 | A | 12/2000 | Miller et al. | |
| 6,160,354 | A | 12/2000 | Ruvinskiy et al. | |
| 6,163,036 | A * | 12/2000 | Taninaka et al. | 257/88 |
| 6,200,134 | B1 | 3/2001 | Kovac et al. | |
| 6,291,839 | B1 | 9/2001 | Lester | |
| 6,318,886 | B1 | 11/2001 | Stopa et al. | |
| 6,319,425 | B1 | 11/2001 | Tasaki et al. | |
| 6,340,868 | B1 | 1/2002 | Lys et al. | |
| 6,366,017 | B1 | 4/2002 | Antoniadis et al. | |
| 6,367,950 | B1 | 4/2002 | Yamada et al. | |
| 6,373,635 | B1 | 4/2002 | Fujimoto et al. | |
| 6,375,340 | B1 | 4/2002 | Biebl et al. | |
| 6,419,384 | B1 | 7/2002 | Lewis et al. | |
| 6,420,199 | B1 | 7/2002 | Coman et al. | |
| 6,455,930 | B1 | 9/2002 | Palanisamy et al. | |
| 6,459,919 | B1 | 10/2002 | Lys et al. | |
| 6,498,355 | B1 | 12/2002 | Harrah et al. | |
| 6,525,335 | B1 | 2/2003 | Krames et al. | |
| 6,534,791 | B1 | 3/2003 | Hayashi et al. | |
| 6,536,923 | B1 | 3/2003 | Merz | |
| 6,547,249 | B2 | 4/2003 | Collins, III et al. | |
| 6,554,451 | B1 | 4/2003 | Keuper | |
| 6,561,640 | B1 | 5/2003 | Young | |
| 6,561,808 | B2 | 5/2003 | Neuberger | |
| 6,573,536 | B1 | 6/2003 | Dry | |
| 6,577,332 | B2 | 6/2003 | Osawa et al. | |
| 6,578,989 | B2 | 6/2003 | Osumi et al. | |
| 6,607,286 | B2 | 8/2003 | West et al. | |
| 6,630,689 | B2 | 10/2003 | Bhat et al. | |
| 6,683,421 | B1 * | 1/2004 | Kennedy et al. | 315/291 |
| 6,686,581 | B2 | 2/2004 | Verhoeckx et al. | |
| 6,708,501 | B1 | 3/2004 | Ghoshal et al. | |
| 6,713,862 | B2 | 3/2004 | Palanisamy et al. | |
| 6,720,859 | B2 | 4/2004 | Mazzochette | |
| 6,796,698 | B2 | 9/2004 | Sommers et al. | |
| 6,798,152 | B2 | 9/2004 | Rooke et al. | |
| 6,800,500 | B2 | 10/2004 | Coman et al. | |
| 6,815,724 | B2 | 11/2004 | Dry | |
| 6,822,991 | B2 | 11/2004 | Collins, III et al. | |
| 6,826,059 | B2 | 11/2004 | Bockle et al. | |
| 6,831,303 | B2 | 12/2004 | Dry | |
| 6,836,081 | B2 | 12/2004 | Swanson et al. | |
| 6,857,767 | B2 | 2/2005 | Matsui et al. | |
| 6,930,870 | B2 | 8/2005 | Nobe et al. | |
| 6,992,335 | B2 | 1/2006 | Ohkawa | |
| 6,995,348 | B2 * | 2/2006 | Bradley et al. | 250/214.1 |
| 7,009,165 | B2 * | 3/2006 | Hehemann et al. | 250/208.2 |
| 7,042,341 | B2 * | 5/2006 | McMahon | 340/426.13 |
| 7,071,493 | B2 | 7/2006 | Owen et al. | |
| 2001/0002120 | A1 * | 5/2001 | Bessendorf et al. | 340/552 |
| 2001/0030782 | A1 * | 10/2001 | Trezza | 359/110 |
| 2001/0046652 | A1 | 11/2001 | Ostler et al. | |
| 2002/0053589 | A1 | 5/2002 | Owen et al. | |
| 2002/0142808 | A1 * | 10/2002 | Abbasi | 455/566 |
| 2002/0187454 | A1 | 12/2002 | Melikechi et al. | |
| 2003/0038943 | A1 | 2/2003 | Almarzouk et al. | |
| 2003/0122749 | A1 * | 7/2003 | Booth et al. | 345/82 |
| 2003/0230765 | A1 | 12/2003 | Dry | |
| 2004/0000677 | A1 | 1/2004 | Dry | |
| 2004/0011457 | A1 | 1/2004 | Kobayashi et al. | |
| 2004/0026721 | A1 | 2/2004 | Dry | |
| 2004/0041521 | A1 | 3/2004 | Mandler et al. | |
| 2004/0090794 | A1 | 5/2004 | Ollett et al. | |
| 2004/0113549 | A1 | 6/2004 | Roberts et al. | |
| 2004/0119084 | A1 | 6/2004 | Hsieh et al. | |
| 2004/0134603 | A1 | 7/2004 | Kobayashi et al. | |
| 2004/0135159 | A1 | 7/2004 | Siegel | |
| 2004/0141326 | A1 | 7/2004 | Dry | |
| 2004/0166249 | A1 | 8/2004 | Siegel | |
| 2004/0201988 | A1 | 10/2004 | Allen | |
| 2004/0206970 | A1 | 10/2004 | Martin | |
| 2004/0238111 | A1 | 12/2004 | Siegel | |
| 2004/0247484 | A1 * | 12/2004 | Yerazunis | 422/82.05 |
| 2005/0018179 | A1 | 1/2005 | Bevis et al. | |
| 2005/0152146 | A1 | 7/2005 | Owen et al. | |
| 2005/0218468 | A1 | 10/2005 | Owen | |
| 2005/0231713 | A1 | 10/2005 | Owen et al. | |
| 2005/0253252 | A1 | 11/2005 | Owen et al. | |
| 2005/0285129 | A1 | 12/2005 | Jackson, III et al. | |
| 2006/0216865 | A1 | 9/2006 | Owen et al. | |

FOREIGN PATENT DOCUMENTS

| | | | |
|---|---|---|---|
| EP | 1158761 | | 11/2001 |
| EP | 1469529 | A2 | 10/2004 |
| GB | 2224374 | A * | 8/1988 |
| GB | 2396331 | A1 | 6/2004 |
| GB | 2399162 | A | 9/2004 |
| JP | 404204333 | A * | 11/1990 |
| JP | 2003268042 | A | 9/2003 |
| WO | 9716679 | | 5/1997 |
| WO | 0037904 | | 6/2000 |
| WO | 0102846 | | 1/2001 |
| WO | 0206723 | | 1/2002 |
| WO | 0226270 | | 4/2002 |
| WO | WO02069839 | A1 | 9/2002 |
| WO | WO03060928 | A1 | 7/2003 |
| WO | WO03096387 | A2 | 11/2003 |
| WO | WO2004009318 | A1 | 1/2004 |
| WO | WO2004011848 | A2 | 2/2004 |
| WO | WO2004038759 | A2 | 5/2004 |
| WO | WO2004078477 | A1 | 9/2004 |
| WO | WO2005041632 | A2 | 5/2005 |
| WO | WO2005043598 | A2 | 5/2005 |
| WO | WO2005043954 | A2 | 5/2005 |
| WO | WO2005091392 | A2 | 9/2005 |
| WO | WO2005094390 | A2 | 10/2005 |
| WO | WO2005100961 | A2 | 10/2005 |

| | | | |
|---|---|---|---|
| WO | WO20050101535 | A2 | 10/2005 |
| WO | WO2006072071 | A2 | 7/2006 |

OTHER PUBLICATIONS

PCT International Search Report and International Preliminary Examination Report dated Nov. 19, 2003 for International PCT Application No. PCT/US03/14625, filed May 8, 2003, 6 pages.

PCT International Search Report and Written Opinion dated Jun. 3, 2005 for International PCT Application No. PCT/US04/36260, filed Oct. 28, 2004, 5 pages.

PCT International Search Report and Written Opinion dated Jun. 17, 2005 for International PCT Application No. PCT/US04/36370, filed Nov. 1, 2004, 6 pages.

PCT International Search Report and Written Opinion dated Aug. 26, 2005 for International PCT Application No. PCT/US05/09407, filed Mar. 18, 2005, 11 pages.

PCT International Preliminary Report on Patentability dated Sep. 28, 2006 for International PCT Application No. PCT/US05/011216, filed Mar. 30, 2005, 6 pages.

Examiner cited in related U.S. Appl. No. 10/984,589, filed Nov. 8, 2004—Electromagnetic Spectrum, 1 page, printed Aug. 16, 2006 www.brocku.ca/earthsciences/people/gfinn/optical/spectrum.gif.

Not yet published related U.S. Appl. No. 11/434,544, filed May 12, 2006 Specification and Figures; 28 pages.

Not yet published related U.S. Appl. No. 11/614,753, filed Dec. 21, 2006 Specification and Figures; 58 pages.

PCT International Search Report and PCT Written Opinion dated Oct. 13, 2006 for International PCT Application No. PCT/US05/13448, filed Apr. 19, 2005, 7 pages.

PCT International Search Report and PCT Written Opinion dated Sep. 28, 2006 for International PCT Application No. PCT/US05/11216 filed Mar. 30, 2005, 8 pages.

PCT International Search Report and PCT Written Opinion dated Oct. 16, 2006 for International PCT Application No. PCT/US05/09076 filed Mar. 18, 2005, 9 pages.

Not yet published related U.S. Appl. No. 11/342,363, filed Jan. 26, 2006; Specification and Figures; 44 pages.

Sensor Synergy; Sensor Synergy—Applications; "Using Inexpensive LEDs as Optical Detectors" http://www.sensorsynergy.com/helpfulhints.htm—2 pages, Purported copyright 2004, Sensor Synergy, Incorporated. 1110 W. Lake Cook Road, Buffalo Grove, IL 60089.

Supplemental European Search Report and written opinion for corresponding EU application No. EP03724539, dated Nov. 21, 2007, 8 pages total.

* cited by examiner

LED ARRAY HAVING ARRAY-BASED LED DETECTORS

This invention claims the benefit of U.S. Provisional Application No. 60/558,205, entitled LED Array With Dual-Use LEDs For Both Illumination And Optical Detection, filed on Mar. 30, 2004, the entire disclosure of which is hereby incorporated by reference and set forth in its entirety for all purposes.

BACKGROUND OF THE INVENTION

Light-emitting semiconductor devices may be arranged in various configurations, such as arrays, for lighting applications. These applications generally have associated parameters (e.g., a photoreaction may entail provision of one or more levels of radiant power, at one or more wavelengths, applied over one or more periods of time). In these applications, the light emitting semiconductor devices generally are employed to provide radiant output and otherwise operate in accordance with various, desired characteristics, e.g., temperature, spectral distribution and radiant power. At the same time, the light emitting semiconductor devices typically have certain operating specifications, which specifications generally are associated with the light emitting semiconductor devices' fabrication and, among other things, are directed to preclude destruction and/or forestall degradation of the devices. These specifications generally include operating temperatures and applied, electrical power.

Arrays of light emitting semiconductor devices have been constructed which provide for monitoring selected of the array's characteristics. Providing such monitoring enables verification of the array's proper operation and, in turn, determination as to whether the array is operating in any way other than properly. An array may be operating improperly with respect to either/both the application's parameters or/and the array's specifications.

Monitoring also supports control of an array's operation. Control, in turn, may be employed to enable and/or enhance the array's proper operation and/or performance of the application. Monitoring the array's operating temperature and radiant output supports control of the array, directly or indirectly, including through adjustment(s) in applied power and cooling (such as through a systemic cooling system). This control may be employed to enable and/or enhance balance between the array's radiant output and its operating temperature, so as, e.g., to preclude heating the array beyond its specifications.

Using control of the array in enabling/enhancing performance of an application may be illustrated via example. In this example, an array is used that is understood to include light emitting diodes (LEDs). Moreover, the application is understood to require provision, in sequence, of light in the red, then green and then blue spectra, at three respective energy levels, while maintaining a select temperature range relating to the work piece. In performing this application, control may again be directed to the array's applied power and to cooling, e.g., by a systemic cooling system. The control is again responsive to the monitoring of the array's operating temperature and radiant output. With this monitoring, the system is enabled to sense the energy applied to the work piece for the first wavelength, compare that energy to the respective energy level, while continually monitoring the temperature. If the temperature approaches its maximum, control may be employed to increase cooling, to decrease the radiant power, or both, while continuing to gauge the applied energy. Once the energy level for the first wavelength is reached, control powers off the LEDs associated with the first wavelength and powers on the LEDs associated with the next sequential wavelength, and so on.

Conventional approaches for monitoring and controlling an array typically propose to mount detectors around the array's perimeter or otherwise proximate to, but separate from the array. In doing so, the detectors detect radiant output or temperature associated with the whole, or relatively large portions of, the array. Moreover, responsive to such detection, the array generally is controlled as a whole, or in relatively large portions. Also, conventional industry approaches may use various detectors, alone or in combination: in some cases, only photo detectors are used; in other cases, only temperature sensors are used; in still other cases, both photo detectors and temperature sensors are used and, in still other cases, some other combination of detectors is used.

An example of conventional monitoring and control of a LED array is found in U.S. Pat. No. 6,078,148, to Hochstein, entitled Transformer Tap Switching Power Supply For LED Traffic Signal (the "'148 Patent"). The '148 Patent, generally, proposes to monitor and control a traffic signal's LED array using a single LED light detector, together with a controller, wherein the LED light detector is disposed proximate to the array (but not part of the array) so as to measure the luminous output of (i) one or more of the array's LEDs or (ii) a so-called "sample" LED which is not part of the array, but performs similarly. Responsive to that measurement, the '148 Patent proposes that the controller provide for selection from among a plurality of taps of a transformer, thereby adjusting the voltage applied to the LED array as a whole and maintaining the luminous output of the traffic signal's LED array. The '148 Patent also proposes (a) provision of a measurement device for measuring the temperature of the LED array generally, (b) selection of a tap responsive to such measurement and (c) associated adjustment of the voltage applied to the LED array as a whole.

Another example of conventional monitoring and control of a LED array is found in U.S. Pat. No. 6,683,421, to Kennedy et al., entitled Addressable Semiconductor Array Light Source For Localized Radiation Delivery (the "'421 Patent"), the contents of which are hereby incorporated by reference as if recited in full herein, for all purposes. The '421 Patent proposes to monitor and control a photoreaction device that includes a LED array, a photo sensor and a temperature sensor. The photo sensor is proposed to preferably comprise semiconductor photodiodes that provide continuous monitoring of the light energy delivered to a work piece, so that irradiation may be controlled.

In one embodiment of the '421 Patent, the LED array is proposed to have an associated output window positioned above the LED array. The output window is proposed to be selected so that a small percentage of the LED array's light energy (typically less than 10%) is internally reflected within the window. This internally reflected light is proposed to be measured by the photo sensor. Not only is this reflected light measured, it is expressly specified that this configuration minimizes or prevents light energy reflected from the work piece or from external sources from being detected by the photo sensor. In order to measure the internally reflected light, the photo sensor is proposed to be positioned and configured for that function, e.g., using a series of photo sensors positioned around the perimeter of the output window. Moreover, it is expressly specified that this measurement using the series of photo sensors will detect changes in average optical power.

This embodiment has disadvantages. As an example, only average optical power is detected. That is, the window captures the internally reflected light from the entire array, which captured light is provided to the sensors. Accordingly, the sensors cannot determine where the LED array's radiant output may be improper and, as such, cannot make adjustments except across the entire array. As well, by seeking to minimize or prevent detection of light energy reflected from the work piece or from external sources, control based on such light energy is precluded.

In another embodiment, the '421 Patent proposes to employ optical fibers between columns of LEDs in the array. The '421 Patent proposes that these fibers, preferably, will be made of material which is able to receive sidewall light emissions from the LEDs of the adjacent column of the LED array. The '421 Patent further proposes that, as to each fiber, the received sidewall light emissions are directed through internal reflection toward a respective photo sensor, the photo sensor being positioned at the perimeter of the array, disposed at the end of the fiber. Apparently, as in the previous embodiment, each photo sensor will measure such light, detecting changes in average optical power.

This embodiment has disadvantages. Again, only an average optical power is detected. Average optical power is again understood in that each fiber captures internally reflected light from the plurality of LEDs disposed across an entire dimension of the array, which captured light is provided to the respective sensor. The respective sensor cannot determine where the LED array's radiant output may be improper across the implicated dimension and, as such, cannot make adjustments except across the entire set of LEDs associated with that fiber. In addition, because the fibers are disposed among the LEDs, in the plane of the array (i.e., so as to capture sidewall light emissions), use of the fibers precludes or degrades use of optics that, desirably, collect and collimate all or substantially all of the radiant output of each LED (such optics include, e.g., a grid of reflectors as proposed by the '421 Patent or a plurality of micro-reflectors in which individual LEDs are mounted, preferably on a one-to-one basis). As well, by detecting only sidewall light emissions, control based on detecting other light energy associated with the array is precluded.

In yet another embodiment, the '421 Patent proposes to position about a LED array a temperature sensor and a plurality of photo detectors. However, the '421 Patent omits to describe the disposition of the temperature sensor or the photo detectors relative to the plane of the LED array. It may be inferred that, as in the embodiment set forth above, the photo detectors are positioned above the array in association with a light guide, e.g., an output window. This inference follows as the '421 Patent expressly specifies that the LED die are arranged in a shape approximating a "filled square", which arrangement would leave no space for the temperature sensor or the photo detectors in the plane of the LED array.

This embodiment has disadvantages. With photo detectors positioned in association with the output window, disadvantages include those set out above respecting other embodiments using light guide(s) to collect detected output radiation. On the other hand, if a sensor or photo detector were placed in the LED array's plane, the sensor or detector would be disposed between the rows and columns of the LED array, contemplating having substantial space between the LEDs of the array. Such space generally is not desirable (i.e., typically, it is desirable to employ densely-packed LED arrays, wherein space between rows and columns of LEDs typically is insufficient to accept interposition of a semiconductor device, such as conventionally-sized sensor or detector).

In still another embodiment, the '421 Patent proposes to group the LEDs of the array into alternating rows, such that the odd rows would form one group and the even rows would form a second group. The '421 Patent further proposes that the odd rows would be energized as a group to emit light energy, including sidewall light emissions, and that the even rows would function, as a group, as a photo sensor (i.e., by generating a current proportional to the intensity of the impinging sidewall light emissions from the one group of odd rows). The '421 Patent further proposes that the respective functions of the odd and even rows may be switched, so that the odd rows operate as the detecting group, while the even rows operate as the emitting group.

This embodiment has disadvantages. Again, average optical power is detected. Average optical power is again understood in that the detecting LEDs, as a group, detect the sidewall light emissions from the emitting group, which emitting group includes all the LEDs of all non-detecting rows of the entire array. The detecting group of LEDs cannot determine where the LED array's radiant output may be improper across any one or more rows of the emitting group and, as such, cannot make adjustments except for the entire group of emitting LEDs. As well, by detecting only sidewall light emissions, control based on detecting other light energy associated with the array is precluded. In addition, because of the potential for relatively substantial reduction of radiant output, it is generally not desirable to use any entire row in the LED array solely to detect, let alone using half of all rows of the LED array for detection.

Accordingly, there is a need for apparatus, systems and methods that employ detectors to monitor selected characteristics of a light emitting semiconductor devices, such as LED arrays. In addition, there is a need for such apparatus, systems and methods that so monitor, while minimizing or eliminating impact on the radiant output that otherwise might result from provision of detectors and related devices and/or structure. Moreover, there is a need for such apparatus, systems and methods that respond to variations and improvements in the light emitting semiconductor devices, including, as examples, where each LED of an LED array is mounted in a respective micro-reflector that collects and collimates the mounted LED's light and/or where the LED array is a dense array. Moreover, there is a need for such apparatus, systems and methods that respond to the applications employing such light emitting semiconductor devices, including, as examples in use of an LED array, by characterizing the LED array's operating characteristics specific to the application and/or by providing for control of the LEDs so as to enable or enhance performance of the application. Generally, there is also a need for apparatus, systems and methods that employ detectors to monitor and enable control of selected characteristics of light emitting semiconductor devices, such as LED arrays and, in doing so, avoid entirely or substantially the disadvantages associated with conventional approaches.

SUMMARY OF THE INVENTION

The present invention provides an optical device that utilizes at least one semiconductor device to measure selected operational characteristics of the optical device such as the radiant output of the array and the temperature of the array.

In one embodiment, one or more detector diodes are positioned within the array to measure the radiant output and/or the heat at one or more selected locations within the array. The detector diodes operate in different modes to measure radiant output and temperature so that in a first mode the detector diodes are selected to measure radiant output and in a second mode the detector diodes are selected to measure temperature.

The present invention provides an optical system that includes an array of semiconductor devices for performing an operation in which the semiconductor devices have multiple characteristics associated with performing the operation. At least one detector is located within the array to selectively monitor multiple characteristics of the semiconductor devices and is configured to generate a signal corresponding to the selected characteristic. A controller is configured to control the semiconductor devices in response to the signal from the detector.

The present invention further provides an optical system having an array of semiconductor devices for performing an operation in which the semiconductor devices having multiple characteristics associated with performing the operation where at least one of the multiple characteristics is concentrated at an area of the array. At least one detector is located within the array at the area of the array to selectively monitor multiple characteristics of the semiconductor devices. The detector is configured to generate a signal corresponding to the selected characteristic. A controller is configured to control the semiconductor devices in response to the signal from the detector.

The present invention further provides an optical system having an array of semiconductor devices for performing an operation and at least one thermal diode located within the array to monitor heat generated by the semiconductor devices. A controller is configured to control the semiconductor devices in response to the signal from the at least one thermal diode.

The present invention further provides a method of controlling an optical system by providing an array of semiconductor devices for performing an operation, the semiconductor devices having multiple characteristics associated with performing the operation, providing at least one detector located within the array to selectively monitor multiple characteristics of the semiconductor devices, the detector configured to generate a signal corresponding to the selected characteristic and providing a controller configured to control the semiconductor devices in response to the signal from the detector.

The present invention further provides an optical system that includes an array of semiconductor devices wherein the array includes one or more semiconductor devices that are electrically coupled to act as a detector.

Utilizing detector diodes in the array to measure optical power and temperature has several advantages. One advantage is that the duty cycle and variance in the radiant intensity of the emitting array is substantially unaffected. Furthermore, since only a few diodes in the array are chosen for power monitoring there is virtually no reduction or loss of total radiant flux. Power monitoring and temperature sensing can be accomplished by providing the appropriate electronic circuitry to variably bias the proper diodes with additional circuitry to monitor the photocurrent. Therefore, using some of the diodes as photodetectors and temperature sensors provides a very efficient means of power monitoring and temperature sensing. In addition, locating detector diodes within the array provides an ideal location for monitoring power and temperature.

These and other embodiments are described in more detail in the following detailed descriptions and the figures.

The foregoing is not intended to be an exhaustive list of embodiments and features of the present invention. Persons skilled in the art are capable of appreciating other embodiments and features from the following detailed description in conjunction with the drawings.

DETAILED DESCRIPTION OF THE INVENTION

Figure 1:
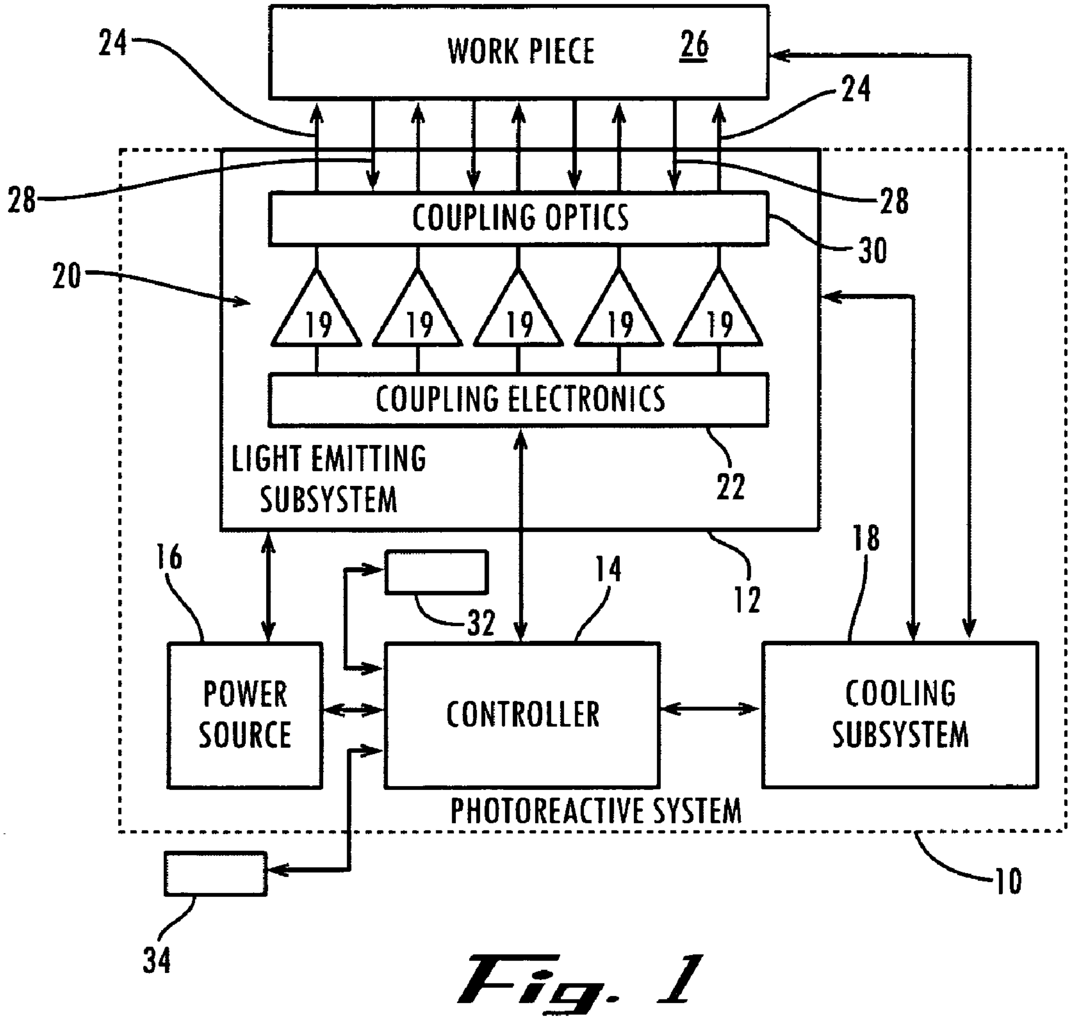
FIG. 1 is a block diagram of a photoreactive system 10 in accordance with the invention.

Representative embodiments of the present invention are shown in FIGS. 1-7 wherein similar features share common reference numerals.

FIG. 1 is a block diagram of a photoreactive system 10 in accordance with the invention. In this example embodiment, the photoreactive system 10 comprises a light emitting subsystem 12, a controller 14, a power source 16 and a cooling subsystem 18.

The light emitting subsystem 12 preferably comprises a plurality of semiconductor devices 19. Selected of the plurality of semiconductor devices 19 are implemented to provide radiant output 24. The radiant output 24 is directed to a work piece 26. Returned radiation 28 may be directed back to the light emitting system 12 from the work piece 26 (e.g., via reflection of the radiant output 24).

The radiant output 24 preferably is directed to the work piece 26 via coupling optics 30. The coupling optics 30, if used, may be variously implemented. As an example, the coupling optics may include one or more layers, materials or other structure interposed between the semiconductor devices 19 providing radiant output 24 and the work piece 26. As an example, the coupling optics 30 may include a micro-lens array to enhance collection, condensing, collimation or otherwise the quality or effective quantity of the radiant output 24. As another example, the coupling optics 30 may include a micro-reflector array. In employing such micro-reflector array, each semiconductor device providing radiant output 24 preferably is disposed in a respective micro-reflector, on a one-to-one basis. Use of micro-lens and of micro-reflector arrays so as to enhance radiant output is shown and described in U.S. patent application Ser. No. 11/084,488, filed Mar. 18, 2005, entitled "MICRO-REFLECTORS ON A SUBSTRATE FOR HIGH-DENSITY LED ARRAY", which application claims priority from U.S. Provisional Application Ser. No. 60/554,628, filed Mar. 18, 2004, the contents of which are hereby incorporated by reference as if recited in full herein for all purposes.

Preferably, each of the layers, materials or other structure have a selected index of refraction. By properly selecting each index of refraction, reflection at interfaces between layers, materials and other structure in the path of the radiant output 24 (and/or returned radiation 28) may be selectively controlled. As an example, by controlling differences in such indexes at a selected interface disposed between the semiconductor devices to the work piece 26, reflection at that interfaces may reduced, toward being eliminated or, at least, minimized, so as to enhance the transmission of radiant output at that interface for ultimate delivery to the work piece 26. Control of indexes of refraction so as to enhance radiant output is shown and described in U.S. patent application Ser. No. 11/083,525, filed Mar. 18, 2005, entitled “DIRECT COOLING OF LEDS”, which application claims priority from U.S. Provisional Application Ser. No. 60/554,632, filed Mar. 18, 2004, the contents of which are hereby incorporated by reference as if recited in full herein for all purposes.

The coupling optics 30 may be employed for various purposes. Example purposes include, among others, to protect the semiconductor devices 19, to retain cooling fluid associated with the cooling subsystem 18, to collect, condense and/or collimate the radiant output 24, to collect, direct or reject returned radiation 28, or for other purposes, alone or in combination. Generally, however, it is preferred to employ coupling optics 30 so as to enhance the effective quality or quantity of the radiant output 24, particularly as delivered to the work piece 26.

Selected of the plurality of semiconductor devices 19 preferably are coupled to the controller 14 via coupling electronics 22, so as to provide data to the controller 14. As described further below, the controller is preferably also implemented to control such data-providing semiconductor devices, e.g., via the coupling electronics 22.

The controller 14 preferably is also connected to, and is implemented to control, each of the power source 16 and the cooling subsystem 18. Moreover, the controller 14 preferably receives data from respective such source 16 and subsystem 18.

In addition to the power source 16, cooling subsystem 18 and light emitting subsystem 12, the controller 14 may also be connected to, and implemented to control, further elements 32, 34. Element 32, as shown, is internal of the photoreactive system 10. Element 34, as shown, is external of the photoreactive system 10, but is understood to be associated with the work piece 26 (e.g., handling, cooling or other external equipment) or to be otherwise related to the photoreaction the system 10 supports.

The data received by the controller 14 from one or more of the power source 16, the cooling subsystem 18, the light emitting subsystem 12, and/or elements 32, 34, may be of various types. As an example the data may be representative of one or more characteristics associated with coupled semiconductor devices 19, respectively. As another example, the data may be representative of one or more characteristics associated with the respective component 12, 16, 18, 32, 34 providing the data. As still another example, the data may be representative of one or more characteristics associated with the work piece 26 (e.g., representative of the radiant outputs energy or spectral component(s) directed to the work piece). Moreover, the data may be representative of some combination of these characteristics.

The controller 14, in receipt of any such data, preferably is implemented to respond to that data. Preferably, responsive to such data from any such component, the controller 14 is implemented to control one or more of the power source 16, cooling subsystem 18, light emitting subsystem 12 (including one or more such coupled semiconductor devices), and/or the elements 32, 34. As an example, responsive to data from the light emitting subsystem indicating that the light energy is insufficient at one or more points associated with the work piece, the controller 14 may be implemented to either (a) increase the power source's supply of power to one or more of the semiconductor devices, (b) increase cooling of the light emitting subsystem via the cooling subsystem 18 (i.e., certain light emitting devices, if cooled, provide greater radiant output), (c) increase the time during which the power is supplied to such devices, or (d) a combination of the above.

The cooling subsystem 18 is implemented to manage the thermal behavior of the light emitting subsystem 12. That is, generally, the cooling subsystem 18 provides for cooling of such subsystem 12 and, more specifically, the semiconductor devices 19. The cooling subsystem 18 may also be implemented to cool the work piece 26 and/or the space between the piece 26 and the photoreactive system 10 (e.g., particularly, the light emitting subsystem 12). Cooling systems providing thermal management in photoreactive systems generally and as to light emitting semiconductor devices in particular are shown and described in U.S. patent application Ser. No. 11/083,525, filed Mar. 18, 2005, as previously described above.

The photoreactive system 10 may be used for various applications. Examples include, without limitation, curing applications ranging from ink printing to the fabrication of DVDs and lithography. Generally, the applications in which the photoreactive system 10 is employed have associated parameters. That is, an application may contemplate parameters as follows: provision of one or more levels of radiant power, at one or more wavelengths, applied over one or more periods of time. In order to properly accomplish the photoreaction associated with the application, optical power may need to be delivered at or near the work piece at or above a one or more predetermined levels (and/or for a certain time, times or range of times).

In order to follow an intended application's parameters, the semiconductor devices 19 providing radiant output 24 generally are to operated in accordance with various characteristics associated with the application's parameters, e.g., temperature, spectral distribution and radiant power. At the same time, the semiconductor devices 19 typically have certain operating specifications, which specifications generally are associated with the semiconductor devices' fabrication and, among other things, should be followed in order to preclude destruction and/or forestall degradation of the devices. Other components of the system 10 also typically have associated operating specifications. These specifications generally include ranges (e.g., maximum and minimum) for operating temperatures and applied, electrical power.

Accordingly, the photoreactive system 10 supports monitoring of the application's parameters. In addition, the photoreactive system 10 preferably provides for monitoring of the semiconductor devices 19, including as to respective characteristics and specifications. Moreover, the photoreactive system 10 preferably also provides for monitoring of the selected other components of the system 10, including as to respective characteristics and specifications.

Providing such monitoring enables verification of the system's proper operation and, in turn, determination as to whether the system 10 is operating in any way other than properly. The system 10 may be operating improperly with respect to either/both the application's parameters, any components characteristics associated with such parameters and/or any component's respective operating specifications. The provision of monitoring is contemplated above, with respect to the descriptions of data provided to the controller 14 by one or more of the system's components.

Monitoring also supports control of the system's operation. Generally, control is implemented via the controller 14 receiving and being responsive to data from one or more system components. This control, as described above, may be implemented directly (i.e., by controlling a component through control signals directed to the component, based on data respecting that components operation) or indirectly (i.e., by controlling a component's operation through control signals directed to adjust operation of other components). In the example set forth above, the semiconductor device's radiant output is adjusted indirectly through control signals directed to the power source 16 that adjust power applied to the light emitting subsystem 12 and/or through control signals directed to the cooling subsystem 18 that adjust cooling applied to the light emitting subsystem 12.

Control preferably is employed to enable and/or enhance the system's proper operation and/or performance of the application. In a more specific example, control may also be employed to enable and/or enhance balance between the array's radiant output and its operating temperature, so as, e.g., to preclude heating the array beyond its specifications while also directing radiant energy to the work piece 26 sufficient to properly complete the photoreaction(s) of the application.

Generally, it is recognized that some applications may require relatively high radiant power, so that sufficient radiant energy may be delivered to the work piece 26 to properly perform the application. Accordingly, it is desirable to implement a light emitting subsystem 12 that is able to output relatively high powered, radiant output. To do so, the subsystem 12 may be implemented using an array of light emitting semiconductor devices 19. In particular, the subsystem 12 may be implemented using a high-density, light emitting diode (LED) array. One such high-density LED array is shown and described in U.S. patent application Ser. No. 10/984,589, filed Nov. 8, 2004, the entire contents of which are hereby incorporated by reference for all purposes. Although LED arrays may be used and are described in detail herein, it is understood that the semiconductor devices 19, and array(s) 20 of same, may be implemented using other light emitting technologies without departing from the principles of the invention, which technologies include, without limitation, organic LEDs, laser diodes, other semiconductor lasers.

Referring specifically to FIG. 1, the plurality of semiconductor devices 19 may be provided in the form of an array 20. The array 20 preferably is implemented so that one or more (and, preferably, most) of the semiconductor devices 19 are implemented to provide radiant output. At the same time, however, one or more of the array's semiconductor devices 19 are implemented so as to provide for monitoring selected of the array's characteristics. As is described further below, the monitoring devices are selected from among the devices in the array and, generally, have the same structure as the other, emitting devices. Generally, the difference between emitting and monitoring is determined by the coupling electronics 22 associated with the particular semiconductor device (e.g., in a basic form, a LED array has monitoring LEDs where the coupling electronics provides a reverse current while having emitting LEDs where the coupling electronics provides a forward current).

As is also further described below, it is contemplated that, based on coupling electronics, selected of the semiconductor devices in the array may be either/both multifunction devices and/or multimode devices, where (a) multifunction devices are capable of detecting more than one characteristic (e.g., either radiant output, temperature, magnetic fields, vibration, pressure, acceleration, and other mechanical forces or deformations) and is switched among these detection functions in accordance with the application parameters or other determinative factors and (b) multimode devices are capable of emission, detection and some other mode (e.g., off) and are switched among modes in accordance with the application parameters or other determinative factors.

Figure 2:
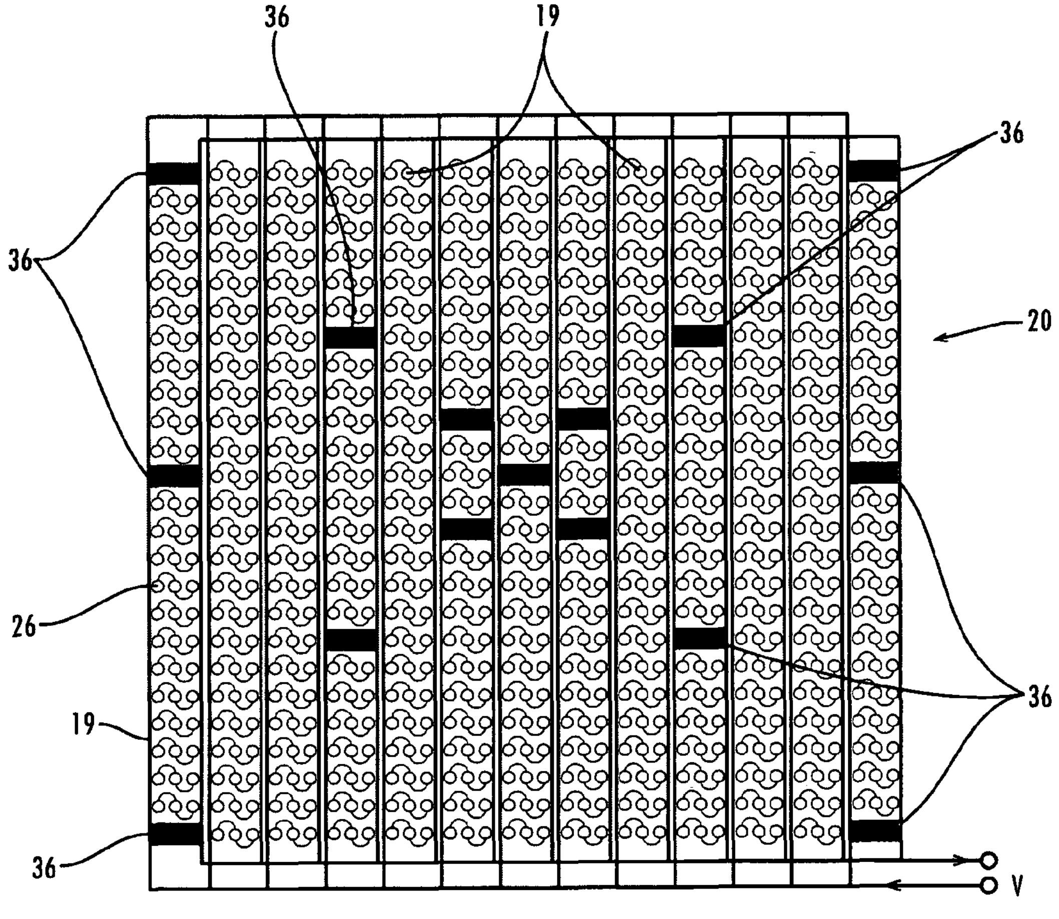
FIG. 2 is a top view of an LED array according to the invention showing an arrangement of detector diodes within the array.

FIG. 2 illustrates one embodiment of an array 20 of semiconductor devices 19, having a set of semiconductor devices 19, at selected positions within the array 20, implemented to perform as detectors, monitoring selected characteristic(s). The selected characteristic(s) may be any one or more of radiant output, temperature or such other characteristic to which the semiconductor device is sensitive. The remaining devices 19 are implemented to provide radiant output. In one example consistent with this embodiment, the semiconductor devices 19 comprise LEDs. The emitting semiconductor devices 19 generally are forward biased. Each detector 36, generally, is sensitive to its respective, selected characteristic, providing a signal or other data representative of the detected characteristic. This data may be provided to the coupling electronics 22 for further conditioning or other processing. In any case, data is ultimately provided to the controller 14 which data is either as detected or subject to such or some other conditioning or processing.

Although FIG. 2 shows a set of detectors 36, it is understood that other sets may be used. A set of detectors may be variously defined. As an example, criteria of a set may be defined to include one or more of: the characteristic(s) detected; whether any of the detectors are multifunction or multimode and, if so the when and/or under what circumstances these detectors switch functions and/or modes; as to detectors that are not multifunction, which detector(s) detect which characteristic(s); the total number of detectors and the detectors' positions within the array; dispositions relative to one another; any dynamic characteristics associated with detection (e.g., detection timing(s) diagrams relative to the application's progress). As another example, detectors may be patterned or grouped, based on convenience, economies, efficiencies, performance, or otherwise, all with or without consideration of any specific application. Patterns can be, e.g., generated randomly or pseudo-randomly, which generation may be done separately by the type of detector or for all employed detectors at once.

In addition, the set of detectors 36 may be defined based on characterization of the specific application using the photoreactive system 10. Characterization is generally known in engineering. Characterization may be variously achieved, including via experience (e.g., running trials and studying/testing the results at selected steps throughout the application), modeling (e.g., computerized emulation, etc.), theoretical analysis (e.g., hitting the books), and otherwise, alone or in selected combinations. Characterization may be performed statically or dynamically, including during production runs of the application.

Characterization, in defining the set of detectors 36 and otherwise the implementation and use of the photoreactive system 10, is preferably used to identify sensitivities relating to the specific application. The identified sensitivities may arise at various steps or times in the application, and may be directed to various components of the system 10 and, in turn, to various parts of the components. Typically, sensitivities may be expected relating to the work piece 26 and/or the array 20. With respect to the work piece 26, for example, the sensitivities may be hot spots, areas of over or under exposure, or other areas of the work piece subject to photoreaction, each of which area will tend to be vulnerable to improper processing unless detected and controlled. With respect to the array 20, for example, the sensitivities may be a hot spot that will tend to cause either improper processing (e.g., inadequate radiant output due to heating) or result in damage to the array (e.g., by operating outside the semiconductor devices' specifications), unless detected and controlled. However, knowing the sensitivities enables implementing a responsively defined set of detectors 36 (e.g., to detect the characteristic at or proximate the area of sensitivity), with proper control following straightforwardly from detection.

Characterization, in defining the set of detectors 36 and otherwise the implementation and use of the photoreactive system 10, may also be used to identify relation(s) between the radiant power detected by detectors 36 and the radiant power called for by the application. Generally, in order to monitor the far-field illumination pattern (or, in other words, the radiant output delivered to the surface of the work piece 26 undergoing the photoreaction), the detectors 36 detect the illumination received back from the work piece 26, i.e., returned radiation 28. By comparing the returned radiation 28 to the radiant output of the array 20, a relationship is found that may be monitored during production so as to control the photoreactive system 10 and, thereby, enable or enhance the proper performance of the application. The returned radiation can also be monitored to observe chemical reactions in the target materials (e.g., monitoring at least one characteristic of the reacting material). This could be achieved by placing more than one different type of light emitting semiconductor into the array in order to detect a range of wavelengths. It is understood that, although one relationship may be found, plural relationships may be found, which relationships may apply variously across the surface of the work piece 26 and/or around and among the array 20, in which case, each such relationship is respectively monitored detector-by-detector and used to control the application via the controller 14. It is also understood that, although returned radiation 28 is described here, other forms of radiation may also be detected and, if so, will generally be factored into and, preferably, negated from the identification of the relationship(s); these other forms of radiation include sidewall light emissions (which are minimized or eliminated through use of coupling optics 30, as described above) and light from external sources (which typically will be minimized or eliminated through proper optical shielding of the work piece and system 10 during production).

With reference to FIG. 2, the set of detectors 36 is 15 in number. The set's detectors are positioned generally around the periphery of the array 20, while also evidencing a weight toward the center of the array 20. With this number and positioning, an example implementation may provide that the 6 peripheral detectors and the 5 central detectors 36 detect radiant output (e.g., based on, among other sources, returned radiation), while the 4 detectors 36 disposed in the middle detect temperature. In this example implementation, the temperature-detecting detectors are so disposed, e.g., due to a known potential for hot spots. On the other hand, the 4 detectors 36 may be disposed in the middle of the array 20 in order to monitor radiant output characterized as being concentrated in this area, responsive to reflectivity of the work piece 26.

With a set of detectors 36 defined and implemented (including, e.g., to detect temperature and radiant output at various locations around and within the array 20), data responsive to the detection(s) is contemplated to be gathered and provided to the controller 14. As previously discussed, this data may indicate that light energy is insufficient at one or more points associated with the work piece 26 and the controller 14 may be implemented to, among other options, increase the power source's supply of power to one or more of the semiconductor devices 19. Further to this, in an example embodiment, selected semiconductor devices 19 are related to one or more respective detector(s) 36, so that when an improper characteristic is found (e.g., insufficient radiant power or heat) in connection with these selected semiconductor devices 19, the controller 14 can control specific part(s) of the system 10 specifically to correct the improper characteristic locally to the devices 19. More specifically, if the selected semiconductor devices (e.g., LEDs) are determined to have insufficient radiant output, the controller 14 may direct the power source 16 to increase power to these particular devices 19 so as to be specifically responsive to and to correct the improper characteristic in these devices 19. While such specific control is contemplated, it is also contemplated to combine such specific control with more general, systemic control (e.g., to increase general cooling in balance with a general increase in power to all devices 19); this may be particularly advantageous when characterization indicates that the improper characteristic of system's component(s) (e.g., selected semiconductor devices) is typically tied to other problems, whether current or upcoming and which can be precluded by proper control.

Referring to FIG. 2, the array 20 includes detectors 36 formed from the diodes comprising the array generally. These detector diodes are integral in and of the array and may be used not only as detector diodes but also to produce the radiant output. The detector diodes typically are addressed by the power source 16 separately from the addressing of the emitting LEDs. The detector diodes may be variously implemented to detect radiant output, including through use in connection with a reverse bias voltage or a transimpedance comparator. The detector diodes may be variously implemented to detect temperature, including through a bias potential scanning circuit.

In a typical embodiment in accordance with the array and detectors of FIG. 1, the detector diodes typically measure a relatively small percentage of the radiant output of the emitting LEDs, such detection typically being based on the returned radiation 28 (as previously describe). The detected radiant output is converted to an electrical current in the reverse-biased detector diodes to monitor the light from the LED array 20. In such a typical embodiment, the detector diodes generally are periodically polled by the controller 14 (e.g., a CPU, micro-controller, or other substitute device); however, it is contemplated that the data may be obtained by or provided to the controller 14, directly or indirectly (e.g., via coupling electronics 22), using any protocol or mechanism, and at such time or times as comports with proper control of the application. In such a typical embodiment, it is also contemplated to retain the data (whether as detected, or after conditioning or other processing) in a data archival system, e.g., so as to monitor detected characteristics (e.g., radiant output and temperature), including over time. Among other things, such a typical embodiment enables determination of the integrity of the array and provides a means to predict the expected lifetime of the array 20 under operating conditions. As well, such a typical embodiment also is to make unnecessary the mounting of any independent and separate photodiodes or other detectors for monitoring characteristics, e.g., radiant output and temperature.

In another embodiment, the LEDs of the array 20 are connected to a power supply having a circuit that monitors the photovoltaic current and applies a variable forward bias potential to LEDs while sensing the current. The photovoltaic current and the forward bias potential can be calibrated to an external standard for the radiant output. The detector diodes are connected to circuitry that allows them to be separately addressed either through a separate module or through circuitry integrated into the power supply. That is, the detector diodes are physically incorporated in the array but are removed from the electronic circuitry that drives the other LEDs with forward current. The detector diodes are instead electrically connected to a different circuit that applies to them a reverse electrical bias. In this reverse-biased condition, the detector diode is no longer a light-emitting diode, but a light-detecting (photodetector) diode.

Figure 3:
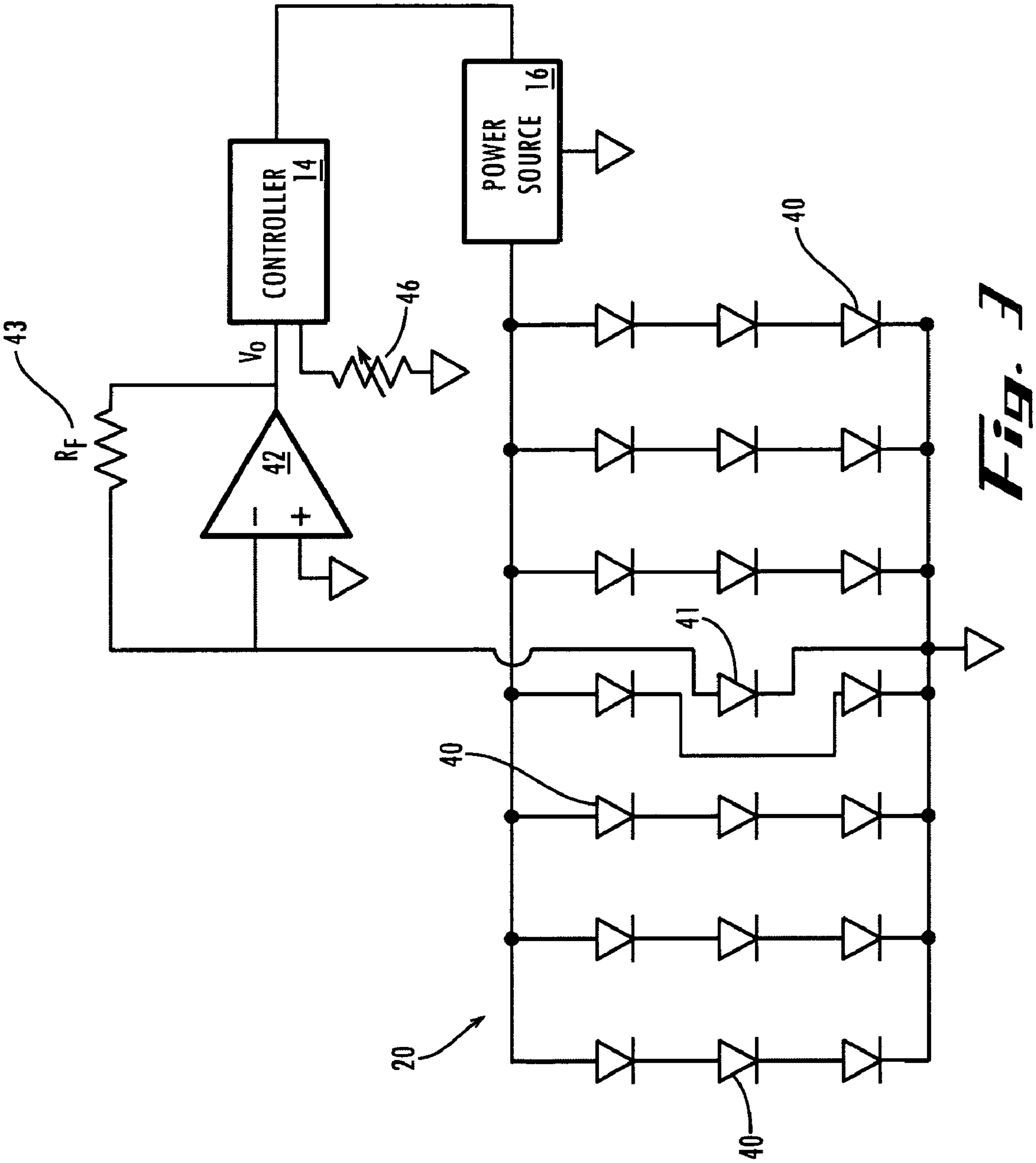
FIG. 3 is a circuit diagram of an embodiment in accordance with the invention.

FIG. 3 is a schematic illustration depicting another embodiment in accordance with the invention. In this embodiment, circuitry is shown that enables use of at least one semiconductor device 19 of an array 20 as a detector 36 from among the other semiconductor devices 19 of the array. As shown, other than the one device used as a detector 36, all other such devices in the array 20 are used to provide radiant output. More specifically, in this embodiment, an array 20 includes a plurality of diodes 40. Except for one of these diodes, all of the plurality of diodes 40 are implemented to emit light. The remaining diode 41 is implemented as a detector 36. In particular, the diode 41 is implemented to detect at least one characteristic, e.g., radiant output or temperature.

Detector diode 41 is mounted on the same substrate as LEDs 40. It is an integral part of the array 20 (e.g., if the array 20 is a dense array, the diode 41 has dimensions consistent with the other diodes of the array so as to maintain density). Although the diode 41 is an integral part of the array 20, it is contemplated that the diode 41 may be a LED or any other diode appropriate for detection of the characteristic (e.g., a silicon diode).

The light emitting diodes 40 are powered by a power source 16. More specifically, the power source 16 is implemented as a constant current programmable power supply outputting a current (I). The power source 16 is controlled by a controller 14. Here, the controller 14 is implemented to have a user-set adjustment mechanism 46 (e.g., a variable resistor, which may be set to provide a desired radiant output level) and an input from coupling electronics 22 (e.g., an operational amplifier 42).

The operational amplifier 42 is configured to measure the photocurrent of the detector diode 41. More specifically, the operational amplifier 42 is configured as a trans-impedance (current-to-voltage converter) amplifier. The amplifier's non-inverting input (+) is grounded. The amplifier's inverting input (−) is coupled to the diode 41, as well as to a feedback resistor (Rf). As such, the inverting input is a virtual ground.

In this embodiment, the photocurrent from the diode 41 is driven into the virtual ground. Therefore, diode 41 is operated in a photovoltaic mode, rather than a reverse-biased mode. With this configuration, a substantially high degree of output linearity is maintained.

Accordingly, the output potential from operational amplifier 42 is:

$$Vo=-I\,Rf$$

where Vo is the output voltage of operational amplifier 42, I is the photocurrent, and Rf is the feedback resistor. The feedback resistor here sets gain. Generally, the output voltage Vo is proportional to the photocurrent from the diode 41, which photocurrent will have some relationship(s) with the radiant output of the array 20 and, therein, some relationship(s) to the radiant output delivered to the work piece 26.

The controller 14 is implemented so as to enable comparison of Vo to a desired set voltage in order to control the power source 16. The power source 16, implemented as a constant current power supply, thereby has its output current adjusted, which adjustment is generally made to maintain a desired radiant output from (or desired temperature for) the emitting array 20.

Notwithstanding the specifics of this depicted embodiment, a number of other embodiments may also be employed. As an example, separate circuits could be used for measuring a plurality of separate detectors 41. As another example, rather than using detector diode(s) in the photovoltaic mode and measuring using a trans-impedance amplifier, it is understood that the detector diodes may be reverse biased and measurements may be taken of the voltage across a bias resistor in order to determine the photocurrent and, accordingly, control the system 10.

As another example, while the depicted embodiment uses a single, array-centric detector diode in and surrounding by a linear array of emitting diodes, it is also understood that any number of detector diodes may be used and that a plurality of detector diodes may be used that are not necessarily adjacent to each other and which may not be array centric. Indeed, all detector diodes may be around the periphery of the array. As well, the detector diodes may be distributed in and throughout the emitting array in order to measure a desired average photocurrent or average temperature. It is also understood that a plurality of detector diodes may be used, together with a plurality of measurement circuits or a single measurement circuit with a switch multiplexer in order to measure particular areas of the emitting array.

Figure 4:
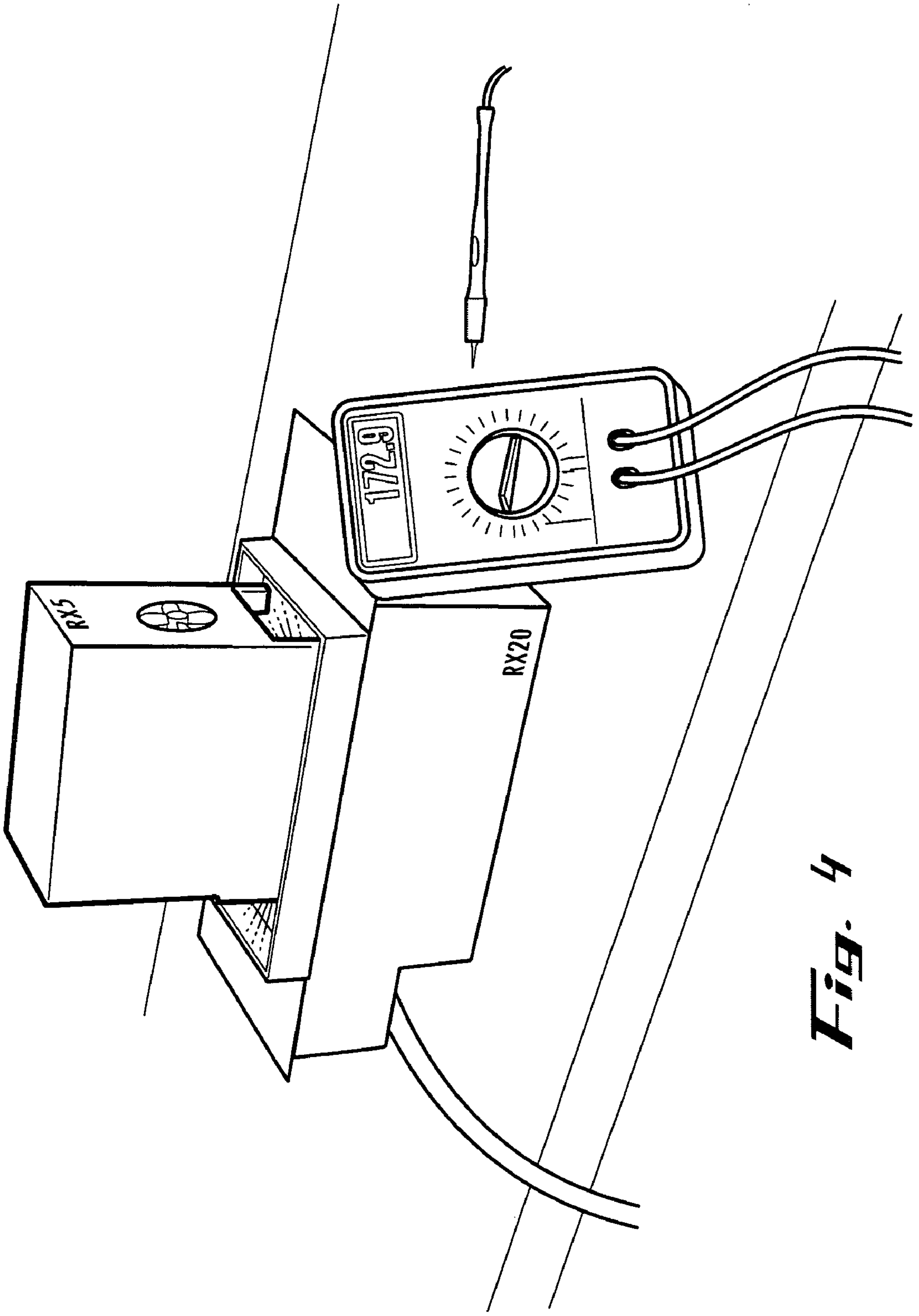
FIG. 4 is shows an experimental setup used to evaluate monitoring in accordance with the invention.

FIG. 4 shows equipment used to evaluate a monitoring technique in accordance with the invention. Here, a detector array is a reverse-biased array model no. RX5 (consisting of blue LEDs) made by Phoseon Technology, Beaverton, Oreg., shown on top (SSDs wired in reverse bias). The light source is a model no. RX20, also made by Phoseon Technology, Beaverton, Oreg., shown on the bottom and inverted to emit light. The photocurrent was measured using an in-line multimeter capable of resolving current with a resolution of 0.1 microamps. The photocurrent of the light source was read with the multimeter shown in the foreground. By changing the drive current to the light source the amount of light was changed, which was read as a change in the photocurrent. The procedure consisted of: setting the current (light output) on the light source, reading the photocurrent from the detector array, turning off the light source, and allowing it to cool down, and repeating the process with a new current.

Figure 5:
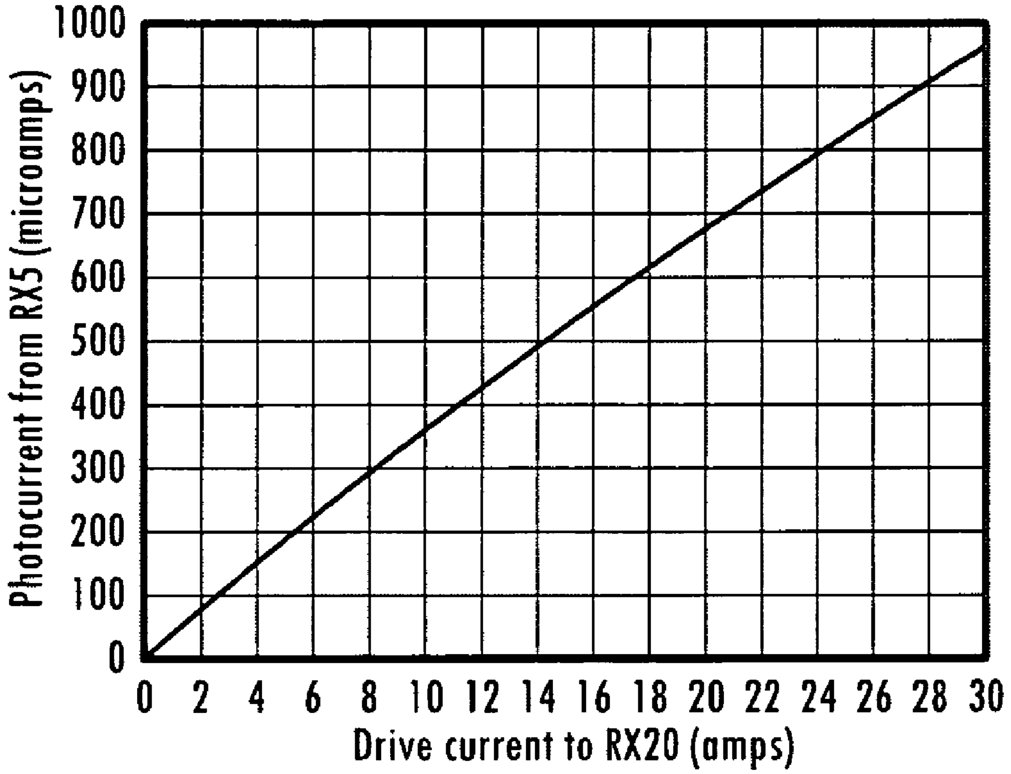
FIG. 5 shows the measured results of the evaluation associated with FIG. 4.

FIG. 5 is a graph showing the measured results of the evaluation of FIG. 4. The horizontal axis represents the drive current to the light source and the vertical axis represents the resulting photocurrent from the detector array. The light source was pulsed on and was not operated at thermal equilibrium. As shown in FIG. 5, there is no indication of saturation in the photo detectors (reverse-biased SSDs) of the detector array even at pulsed conditions three times the nominal operating condition. Furthermore, the high photocurrent (nearly a milliamp) generally is readily measured, indicating promise for monitoring consistent with this evaluation technique.

The evaluation indicates several desirable aspects. It requires no additional hardware, e.g., no additional photo detectors or mounting equipment. It enables distribution of light sensor detector diodes (photodiodes) throughout the array, thus providing distributed performance measures over the life of the device. Furthermore, it provides radiant output monitoring integral with the array. As well, it has no moving parts, and the detector diodes generally do not interfere with the radiant output. Also, it provides a means of configuring the RX product to give a specified dose of UV radiation.

Of course, this evaluation method contemplates that the detector diodes are physically wired into the circuit board differently than the emitting LEDs. In that way, the detector diodes can be biased in reverse at a constant voltage. Also, additional circuitry is used to sense the photocurrent and store the information, but such circuitry is anticipated for any such monitoring effort. In addition, if the emitting LEDs are mounted in a reflector cup, as is desirable, the emitting LEDs will be optically shielded from the detector diodes (except for reflections off a window and off the work piece 26), which generally is indicated by reduced photocurrents.

Figure 6:
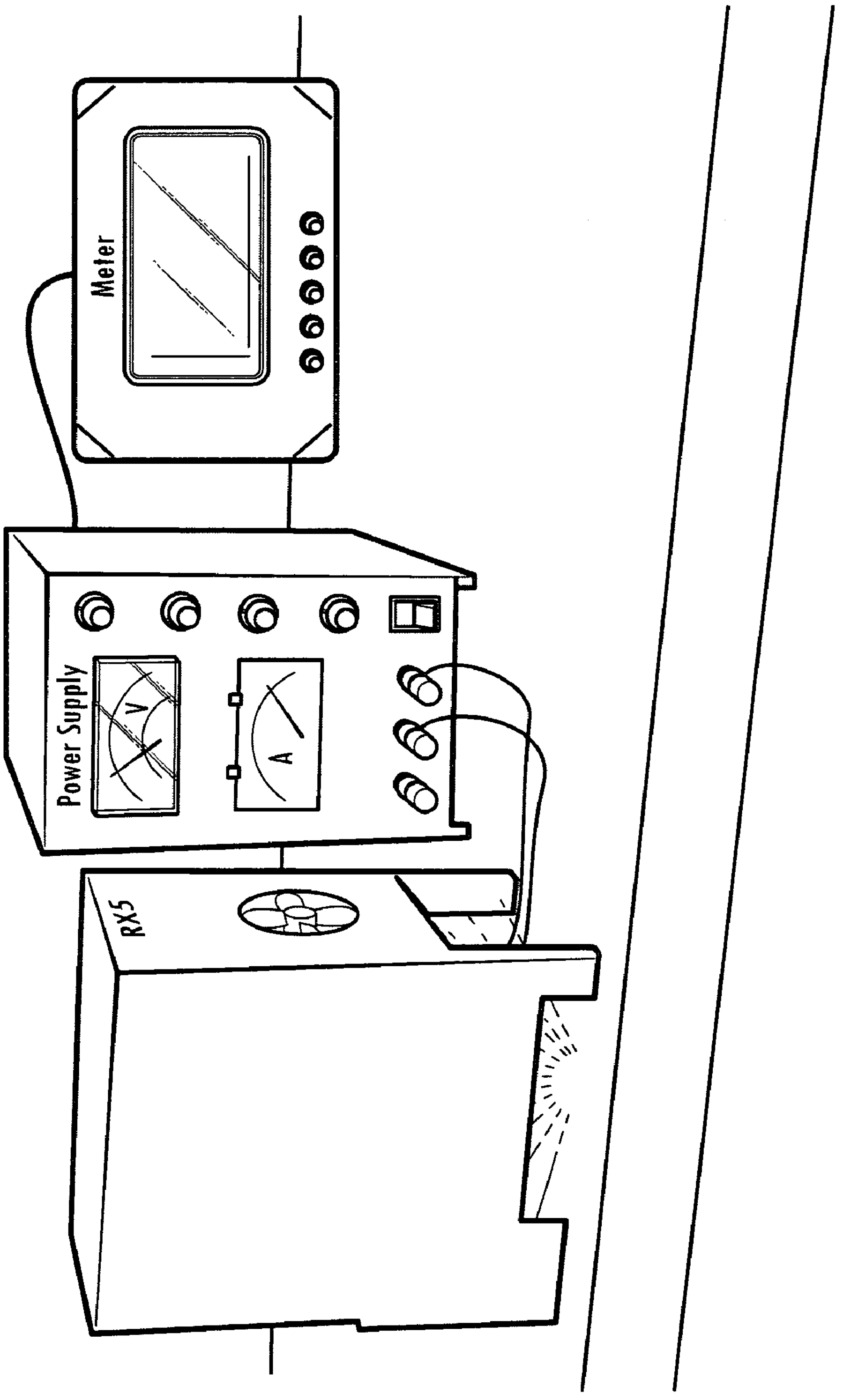
FIG. 6 shows a long-term setup used to evaluate monitoring in accordance with the invention.

FIG. 6 shows a long-term setup showing the detector array housing with a single LED board (as in FIG. 4) and operating with a single power supply. One of the columns in the LED array has been electrically removed from the forward-current circuit and is reverse-biased. A multimeter is used to sense the voltage across a 100,000 ohm resistor. This voltage has been found to be substantially proportional to the photocurrent (and hence optical flux) generated in the reverse-biased detector diodes by the LEDs. Typical voltage drop across the 100,000 ohm resistor has been measured at about 0.75 ohm and, as such, the photocurrent in this test (10.0 volts, 3.9 amps—driving the fan and LED array in parallel) is determined to be about 7.5 microamps.

Another embodiment of the invention includes one or more multi-use devices. Multi-use devices are understood to be either multimode or multifunction, or both. Devices that are multifunction are able to be configured so as to detect from among a plurality of characteristics, such as, for example, radiant output, temperature, magnetic fields, or vibration. Multifunction devices preferably are dynamically configurable. Multifunction devices are switched among these detection functions in accordance width the application parameters or other determinative factors. Devices that are multimode are capable of, for example, emission, detection and other modes (e.g., off). Multimode devices preferably are dynamically switchable. Multimode devices are switched among modes in accordance with the application parameters or other determinative factors.

Figure 7:
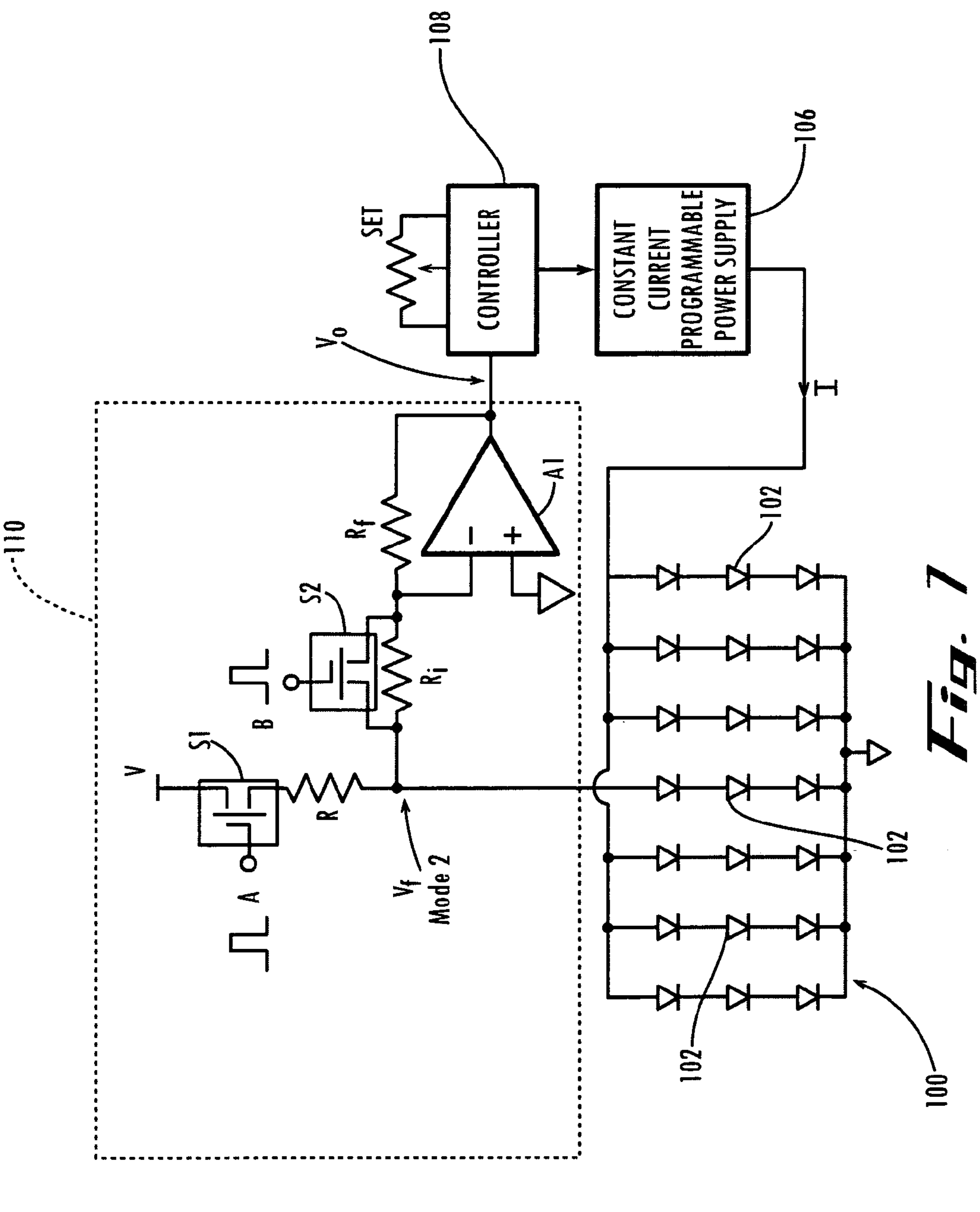
FIG. 7 is a circuit diagram of an embodiment in accordance with the invention.

One example of a multifunction device is shown and described in FIG. 7. In this embodiment, an optical array 100 includes at least one semiconductor device 102 used as a detector diode that can be switched to measure the radiant output of the array and the temperature of the array. Detector diode 102 may be of the type discussed above with reference to FIG. 3 for measuring radiant output, but also measures the temperature of array 100. Preferably, detector diode 102 is placed at a selected location within array 100 to measure radiant output and temperature. The selected location is determined by a number of factors such as, for example, the particular process for which array 100 is used as discussed above with reference to FIG. 3 and/or the material of the substrate. For example, substrates of certain materials may have “hot spots” or areas that are more susceptible to heat generated by the LEDs than other areas. In such circumstances, detector diode 102 is located within array 100 at or near the “hot spot” to measure temperature.

Detector diode 102 measures radiant output as discussed above and utilizes the forward bias potential dependence on temperature to measure the thermal performance of the system. Detector diode 102 is an integral part of array 100 and may be used not only as detector diode but also to produce the radiant intensity of the system. Detector diode 102 is addressed separately by the power supply from the illuminating LEDs. Detector diode 102 is periodically polled by a CPU or controller. The temperature data is retained in a data archival system to monitor the temperature and adjust the power to array 100 accordingly.

In the embodiment of FIG. 7, semiconductor devices 102 are powered by a constant current programmable power supply 106 that outputs a current (I). Power supply 106 is programmed by a controller 108 that has a user set adjustment and an input from operational amplifier (A1). Array 100 includes one or more diodes 102 for measuring radiant output and temperature. Diodes 102 may be LEDs or other appropriate diodes, such as, for example, silicon diodes.

Diodes 102 used for detection are connected to a circuit 110 for operation in either one of two modes. In a first mode (mode 1), detector diodes 102 measure radiant output from emitting diodes or the LEDs. In a second mode (mode 2), the detector diodes 102 measure temperature. Operational amplifier (A1) is used for both mode 1 and mode 2. Switches S1 and S2 are employed to switch between modes. Although FIG. 7 omits to depict a mechanism controlling the switches, it is understood that, in an example embodiments controller 108 provides that control. Moreover, it is also understood that controller 108 of FIG. 7 generally functions correlatively to the controller 14 of FIG. 1 (e.g., control of the switches S1 and S2 correlates to control of the coupling electronics 22 in FIG. 1).

In mode 1, operational amplifier (A1) is configured as a trans-impedance (current-to-voltage) amplifier with the photocurrent from the detector diodes 102 driven into a virtual ground to maintain the highest degree of output linearity. In mode 1, switch (S2) is closed in order to short out input resistor (Ri) and switch (S1) is opened to prevent voltage (V) from imposing a current into the detecting diodes. The output from operational amplifier (A1) is:

$$Vo=-I\,Rf$$

where (Vo) is the output voltage of operational amplifier (A1), (I) is the detected photocurrent, and (Rf) is the feedback resistor from operational amplifier (A1) output to inverting output. The non-inverting input is grounded so that detector diodes 102 see virtual ground at the inverting input terminal of operational amplifier (A1). The controller compares output voltage (Vo) to a desired set voltage to command programmable power supply 106 to change its output current, e.g., to maintain the desired emitting array output level.

In mode 2, a current from voltage (V) is used with resistor (R) to provide a forward bias for detector diodes 102. In mode 2, switch (S1) is closed and switch (S2) is open. Operational amplifier (A1) is configured as an inverting amplifier and the output will be:

$$Vo=-Vf(Rf/Ri)$$

where (Vo) is the output from operational amplifier (A1), (Vf) is the forward voltage of detector diodes 102 (which is a function of diode temperature), (Rf) is the feedback resistor from operational amplifier (A1) output to the non-inverting input of operational amplifier (A1), and (Ri) is the input resistor from detector diodes 102 to the non-inverting input of operational amplifier (A1). In mode 2, the output voltage (Vo) will be a function of temperature of array 100. For example, if detector diodes 102 are silicon, (Vf) is approximately 0.600 volts at 25 degrees C. as determined by the diode equation:

$$I=Isat[(\exp qV/kt)-1)]$$

and would change approximately −1.8 mV/degree C. In the embodiment of FIG. 7, three diodes 102 in series would result in a change of −5.4 mV/degree C.

The measured value of temperature may be used by controller 108 to limit the power supply current in order not to exceed a desired temperature level that might be harmful to array 100. Controller 108 may also activate fans or other cooling means (such as seen at 18 in FIG. 1) or disable power supply 106 (e.g., upon the loss of cooling means when the temperature exceeds a certain level).

In the event that there is interaction between the modes 1 and 2, i.e., that illumination of the detector diodes varies the output of the temperature measurement function, the controller can apply a pre-determined algorithm to subtract off the error produced by the photocurrent during the temperature measurement function. Alternatively, the controller can use other diodes to sense the temperature and determine the photovoltaic current concurrently with the temperature.

Although FIG. 7 shows one or more diodes that measure both radiant output and temperature, this invention is not limited to such an arrangement. For example, the array may include one or more thermal diodes to measure only the temperature. The diodes selected for measuring temperature may be connected to separate circuits from light emitting diodes or light sensing diodes. For example, the thermal diodes may be darkened to measure the temperature of the array. Diodes may be darkened a number of ways including coating the diode with an opaque material or covering the diode with a controllably opaque/transparent cover. Furthermore, the diodes may be darkened by turning off power to emitting LEDs in the array and thereupon measuring temperature. Additionally, the embodiment of FIG. 7 shows a linear array of three detector diodes contained in a linear array of emitting diodes. However, it is possible to locate a plurality of detector diodes throughout the LED array to measure a desired average photocurrent and/or average temperature. Alternatively, the array may include a plurality of detector diode segments with corresponding measurement circuits or a single measurement circuit with a switch multiplexer to measure particular areas of the LED array. Alternatively each segment/series may be illuminated for a certain percentage of operational time (99%, for example) and used as a detector the rest of the operational time (1%) to get a mapping of the illumination without affecting the time-averaged uniformity.

Persons skilled in the art will recognize that many modifications and variations are possible in the details, materials, and arrangements of the parts and actions which have been described and illustrated in order to explain the nature of this invention and that such modifications and variations do not depart from the spirit and scope of the teachings and claims contained therein.

What is claimed:

1. An optical system, comprising:

an array light-emitting diodes arranged to perform an operation, the operation having one or more characteristics of the light emitting diodes in association with a particular area of the array;

at least one of the light-emitting diodes in the array being configured solely as a detector electrically connected to a circuit different from that of the other light-emitting diodes, the circuit to apply a reverse electrical bias to the detector light-emitting diode, the detector light-emitting diode arranged to operate in a photovoltaic mode and having its output coupled to a trans-impedance amplifier to generate a signal proportional to a photocurrent from the detector, the detector located in a selected position in the array to monitor one or more characteristics of the light emitting diodes of the particular area of the array; and a controller configured to control the particular area of the array responsive, at least in part, to the signal from the at least one detector.

2. The optical system of claim 1, wherein the at least one of the multiple characteristics is radiant output of the light emitting diodes.

3. The optical system of claim 1, wherein the at least one light emitting diode in the array being implemented to function solely as a detector comprises multiple detectors located in multiple selected positions to monitor one or more characteristics of multiple areas of the array.

4. An optical system for performing an operation on a work piece, comprising:

an array of light-emitting diodes;

at least one of such light-emitting diodes in the array electrically configured in a trans-impedance mode to operate solely as a light detecting device and being connected to a circuit that applied a reverse bias separate from a driving circuit for the other light-emitting diodes in the array, the trans-impedance mode including a trans-impedance amplifier such implementing enabling the light detecting device to function solely as a detector of characteristics of the semiconductor devices and not an emitter;

at least one of the semiconductor devices performs as a thermal diode detector within the array to detect and generate a signal responsive to heat; and a controller configured to control the array responsive, at least in part, to the signal.

5. The optical system of claim 4, further comprising coupling electronics, the coupling electronics providing for coupling one or more of the semiconductor devices with the controller, whereby the controller controls such coupled semiconductor devices, at least in part, by controlling the coupling electronics.

6. The optical system of claim 4, wherein the controller controls one or more of the semiconductor devices so as to detect one or more of (i) radiant power output by the semiconductor devices that emit light or radiant power received at the work piece, and/or (ii) wavelengths or frequencies of electromagnetic radiation associated with one or more the array, the work piece and/or the operation.

7. The optical system of claim 4, wherein the light detecting device is located in a selected position in the array and the thermal diode detector is located in a second selected position in the array.

8. An optical system for performing an operation on a work piece, comprising:

an array of light emitting diodes;

at least one of the light emitting diodes in the array electrically connected in a photovoltaic mode to a circuit separate from driving circuitry for other light emitting diodes in the array, causing the at least one of the light emitting diodes to function solely as a detector of one or more selected characteristics of the other light emitting diodes, the detector located in a selected position in the array; and, a controller configured to control the light emitting diodes capable of emitting light in the particular area of the array according to a signal from at least one of the light emitting diodes connected to function solely as a detector.

9. The optical system of claim 8, wherein such at least one of the light emitting diodes connected to function solely as a detector detects one or more characteristics associated with the work piece and/or with other non-array components of the system.

10. The optical system of claim 9, wherein such at least one of the light emitting diodes connected to function solely as a detector detects power, wavelength and/or frequency of electromagnetic radiation associated with the work piece and/or the operation.

11. The optical system of claim 8, wherein the array has a physical arrangement of the light emitting diodes to emit light toward providing selected irradiation of the work piece in association with performing the operation; and wherein such at least one of the light emitting diodes connected to function solely as a detector generates one or more signals responsive to the heat of the array and/or work piece; and wherein, responsive at least in part to the one or more so-generated signals, the controller controls the array.

12. The optical system of claim 8, further comprising coupling electronics, the coupling electronics providing for coupling one or more of the light emitting diodes with the controller, whereby the controller controls such coupled light emitting diodes to emit light, at least in part, by controlling the coupling electronics.

13. The optical system of claim 8, wherein the at least one such light emitting diodes to function solely as a detector comprises multiple detectors located in multiple particular areas of the array.

14. The optical system of claim 9, wherein, responsive to detection of at least one of the light emitting diodes connected to function solely as a detector, the controller controls one or more of the power source, the controller, the light emitting subsystem and/or other components of the optical system.

* * * * *